United States Patent
Keating

(10) Patent No.: US 8,237,515 B2
(45) Date of Patent: Aug. 7, 2012

(54) CRYSTAL OSCILLATOR TEMPERATURE CONTROL AND COMPENSATION

(75) Inventor: Pierce Keating, Issaquah, WA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/075,307

(22) Filed: Mar. 10, 2008

(65) Prior Publication Data

US 2008/0218279 A1  Sep. 11, 2008

Related U.S. Application Data

(60) Provisional application No. 60/906,029, filed on Mar. 9, 2007.

(51) Int. Cl.
*H03L 1/04* (2006.01)
*H03B 5/32* (2006.01)

(52) U.S. Cl. ............. 331/176; 331/44; 331/66; 331/158

(58) Field of Classification Search .............. 331/44, 331/66, 154, 158, 176; 310/315, 361
See application file for complete search history.

(56) References Cited

U.S. PATENT DOCUMENTS

| | | | |
|---|---|---|---|
| 5,041,800 A | 8/1991 | Long et al. | |
| 6,160,458 A | 12/2000 | Cole et al. | |
| 6,414,559 B1 * | 7/2002 | Cole et al. | 331/158 |
| 6,580,332 B2 * | 6/2003 | Sutliff et al. | 331/158 |
| 6,630,872 B1 * | 10/2003 | Lanoue et al. | 331/176 |
| 6,664,864 B2 | 12/2003 | Jiles et al. | |
| 6,750,729 B2 | 6/2004 | Kim et al. | |
| 6,784,756 B2 * | 8/2004 | Villella | 331/176 |
| 7,253,694 B2 * | 8/2007 | Hardy et al. | 331/176 |
| 7,310,024 B2 * | 12/2007 | Milliren et al. | 331/69 |
| 7,482,889 B2 * | 1/2009 | Stolpman | 331/176 |
| 2003/0043522 A1 | 3/2003 | Schmalz | |
| 2003/0184399 A1 | 10/2003 | Lanoue et al. | |
| 2006/0276244 A1 | 12/2006 | Hornik et al. | |
| 2007/0004506 A1 | 1/2007 | Kinsley et al. | |
| 2007/0026942 A1 | 2/2007 | Kinsley et al. | |

OTHER PUBLICATIONS

International Preliminary Report on Patentability for PCT/US2008/056689.

* cited by examiner

*Primary Examiner* — Levi Gannon

(74) *Attorney, Agent, or Firm* — Sterne, Kessler, Goldstein & Fox PLLC

(57) ABSTRACT

Crystal oscillator control and calibration is disclosed. Temperature and frequency control circuits included on a printed circuit board (PCB) comprising a crystal oscillator are used to determine, for each of a plurality of set points in a range of sensed internal temperatures sensed by an internal temperature sensing circuit or device located adjacent to the oscillator in a thermally insulated region of the PCB, a corresponding compensation required to be applied to maintain a desired oscillator output frequency. The PCB is configured to use at least the determined compensation values and a sensed internal temperature to determine during operation of the PCB a compensation, if any, to be applied to maintain the desired oscillator output frequency.

20 Claims, 5 Drawing Sheets

CRYSTAL OSCILLATOR TEMPERATURE CONTROL AND COMPENSATION

CROSS REFERENCE TO OTHER APPLICATIONS

This application claims priority to U.S. Provisional Patent Application No. 60/906,029, entitled METHOD OF CRYSTAL OSCILLATOR TEMPERATURE CONTROL AND CHARACTERIZATION, filed Mar. 9, 2007 which is incorporated herein by reference for all purposes.

BACKGROUND OF THE INVENTION

The output (e.g., frequency) of a crystal oscillator typically varies as the temperature of the oscillator changes. One common approach to avoiding such variation is to employ an "ovenized" crystal oscillator, in which the oscillator is enclosed in a thermally insulated area and heated to a temperature that is above the highest ambient temperature in which the oscillator is expected and/or designed to operate. However, some variation in temperature may still be experienced, even in an ovenized oscillator. Typically, to enable for temperature effects to be compensated for, crystal oscillators have been calibrated in a temperature controlled test environment, during oscillator manufacture, and compensation data associated with different operating temperatures, such as control voltages, provided by the crystal oscillator manufacturer to a purchaser of the oscillator, e.g., a purchaser who acquires to oscillator to incorporate it in a PCB or other assembly. Such calibration and compensation data capture and transfer by the oscillator manufacturer require time, personnel, testing facility, and other resources that increase the cost of crystal oscillators.

BRIEF DESCRIPTION OF THE DRAWINGS

Various embodiments of the invention are disclosed in the following detailed description and the accompanying drawings.

DETAILED DESCRIPTION

Figure 1A:
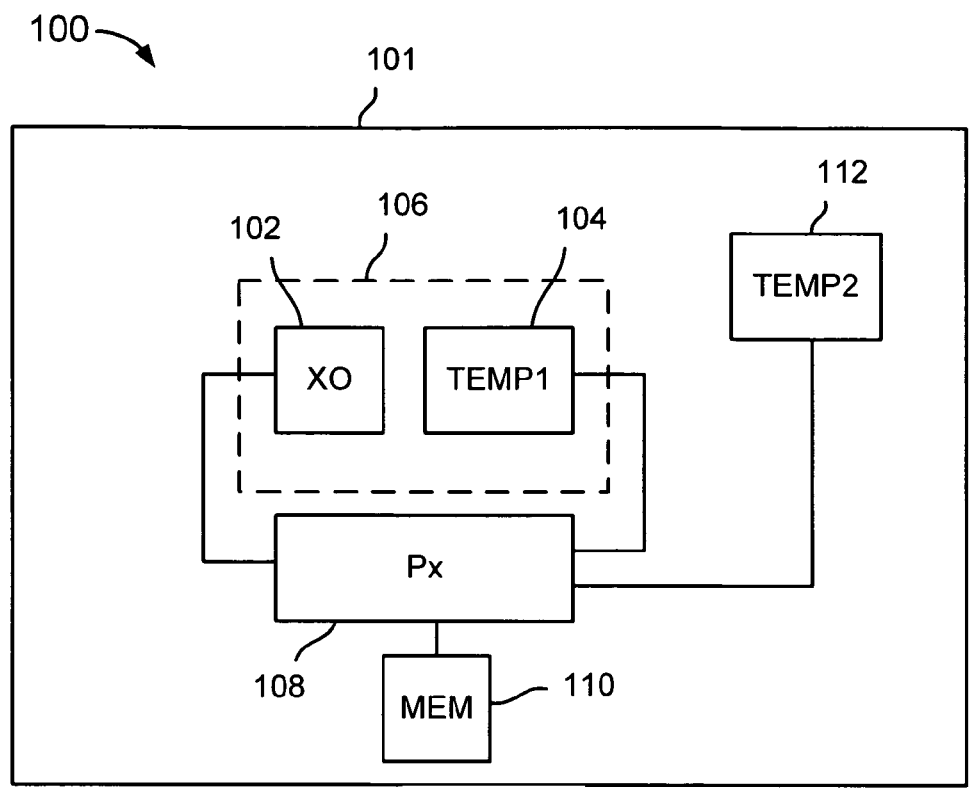
FIG. 1A is a block diagram showing a top view of an embodiment of a system configured to perform onboard temperature calibration and control.

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Crystal oscillator onboard temperature calibration and control are disclosed. In some embodiments, a crystal oscillator (XO) such as a variable XO, temperature compensated XO, or ovenized XO is mounted on one side of a printed circuit board (PCB). Adjacent to the XO is a first temperature sensing IC. On the other side of the PCB, opposite to the first temperature sensing IC and XO is a power transistor. Preferably, the XO, first temperature IC, and power transistor are covered with heat insulating material. In some embodiments, a second temperature sensing IC is mounted on the PCB and is not covered with the heat insulating material. In operation, a control loop biases the power transistor to dissipate heat such that the first temperature sensing IC detects a substantially constant temperature. The second temperature sensing IC detects an ambient temperature. In some embodiments the ambient temperature is detected by an external circuit and/or component not on the PCB. On a representative PCB, or for each PCB in a representative subset of PCBs, a temperature gradient between the XO and the first temperature sensing IC is determined over a range of ambient temperature readings given a substantially constant temperature reading of the first temperature sensing IC. For each of a plurality of PCBs including at least one PCB for which the temperature gradient was not separately determined by taking measurements with respect to that PCB, the temperature characteristics of an XO are determined, e.g., during manufacture, through a relatively narrow range of temperatures as sensed by the first temperature sensing IC, the relatively narrow range of temperatures including a design temperature the PCB is designed to attempt to maintain at the first temperature sensing IC and the range being more narrow than a wider range of ambient temperatures used to determine the temperature gradient characteristic(s) of the PCBs. In operation, a sensed or otherwise received ambient temperature may be used together with the PCB-specific temperature characteristics and the temperature gradient information gathered using the representative PCB(s) to determine a compensation to be applied with respect to the XO. In various embodiments, the crystal oscillator is compensated by tuning an oscillator control voltage and/or by fine tuning the power transistor bias to compensate for the temperature gradient, given an ambient temperature reading.

In this way, the temperature control loop is itself used to characterize the frequency versus temperature variations of the crystal oscillator relatively quickly in manufacturing. Also, because the oscillator will be temperature controlled, the range of temperatures over which the oscillator must be characterized is greatly reduced compared with the ambient temperature range, thus further reducing the time required to characterize the oscillator over temperature. Further, a second temperature sensing IC which provides an ambient temperature reading, or another source of a current ambient temperature reading, is used in various embodiments to compensate for temperature gradients in the temperature controlled structure during normal operation, thus canceling residual errors due to the temperature gradients.

Figure 1B:
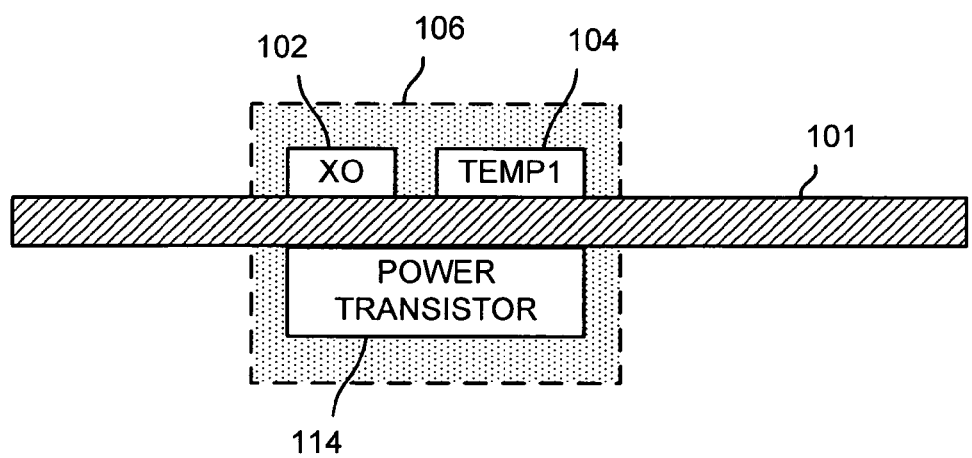
FIG. 1B is a block diagram showing a side cross-sectional view of a portion of the system of FIG. 1A.

FIG. 1A is a block diagram showing a top view of an embodiment of a system configured to perform onboard temperature calibration and control. In the example, a printed circuit board (PCB) assembly 100 includes a PCB substrate 101 on which a crystal oscillator (XO) is disposed adjacent to a first temperature sensing circuit (TEMP1) 104 within a thermally insulated area 106. In various embodiments, the circuit 104 comprising a thermistor and/or other components configured to provide an output indicative of a temperature sensed at the thermistor. The oscillator 102 is connected to a microprocessor (or other controller or circuit) 108 configured to control the oscillator 102, e.g., by providing a temperature compensation or other control voltage or other signal to the oscillator 102. The temperature sensing circuit 104 also has a connection to microprocessor 108, which is configured to receive from temperature sensing circuit 104 a signal indicating a sensed temperature that has been sensed by circuit 104 and to use the sensed temperature to control a heating circuit, e.g. by driving a power transistor or other heat generating device, component, or circuit located on an opposite side of PCB assembly 100 (as shown in FIG. 1B). In the example shown, a second temperature sensing circuit 112 is configured to provide to microprocessor 108 a signal indicating an ambient temperature sensed by the circuit 112. In various alternative embodiments, the ambient temperature is sensed by a device or component external to PCB assembly 100 and is provided to microprocessor 108 via an external connection to PCB assembly 100. The processor 108 is connected to a memory 110. In various embodiments, data used by microprocessor 108 to compensate the oscillator 102 for changes in internal and/or ambient temperature, as applicable, are stored in memory 110, as described more fully below. In some embodiments, temperature gradient data obtained using one or more representative PCBs and/or PCB-specific oscillator temperature characteristic data, such as described above, are stored in memory 110.

FIG. 1B is a block diagram showing a side cross-sectional view of a portion of the system of FIG. 1A. FIG. 1B shows a power transistor 114 disposed on a side PCB substrate 101 that is opposite the side on which the oscillator 102 and first temperature sensing circuit 104 are located. Thermal insulating material 106 encloses the components 102, 104, and 114 on their respective sides of substrate 101.

In some embodiments, the region enclosed by insulating material 106 is further thermally isolated from other parts of the PCB assembly 100 by removing portions of the PCB substrate 101 in the vicinity of said components, for example prior to depositing insulating material 106. In some embodiments a remaining portion of substrate 101, on which portion components 102, 104, and 114 are located, is connection to the remainder of the PCB only by relatively narrow bridges of PCB substrate material.

In some embodiments, the power transistor 114 of FIG. 1B has a connection (not shown) to microprocessor 108, which is configured to compare a sensed temperature indicated by sensing circuit 104 to a design or target value and drive power transistor 114 as required to achieve and maintain the design temperature as sensed at circuit 104.

Figure 2:
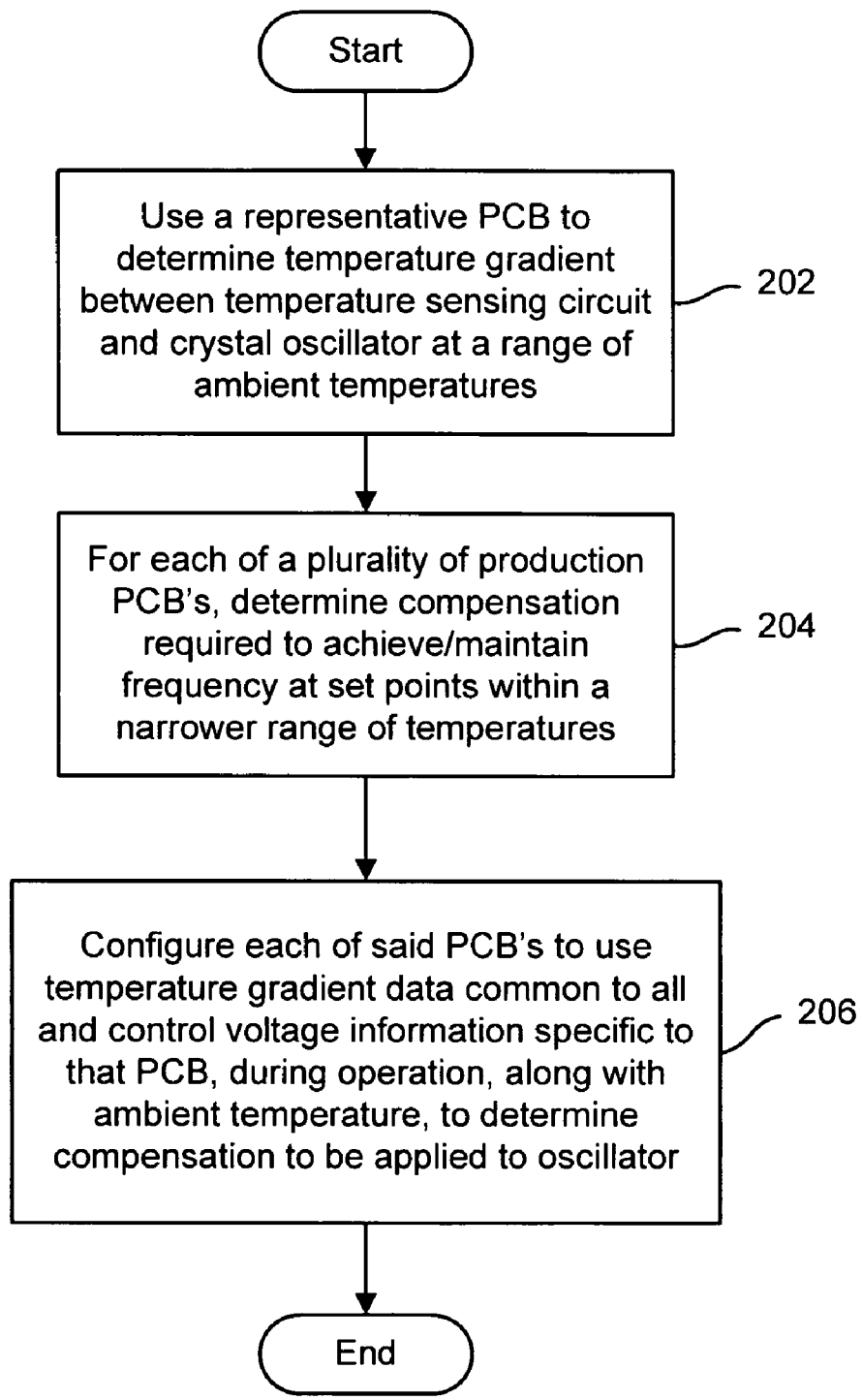
FIG. 2 is a flow chart illustrating an embodiment of a process for temperature characterization, calibration, and control.

FIG. 2 is a flow chart illustrating an embodiment of a process for temperature characterization, calibration, and control. In the example shown, a representative PCB, or in some embodiments a representative subset of PCBs, is used to determine a temperature gradient between a temperature sensing circuit (e.g., circuit 104 of FIGS. 1A and 1B) and an oscillator (e.g., oscillator 102) at a range of ambient temperatures to which a PCB assembly is expected and/or designed to be exposed (202). For each of a plurality of production PCBs, including one or more PCBs other than the representative PCB(s), control voltages (or other compensation) required to achieve and/or maintain a design (or other) oscillator output frequency at a series of set points within a relatively narrower range of temperatures, i.e., a range narrower than the range of ambient temperatures used to determine the temperature gradient, are determined (204). In some embodiments, the control voltages and/or other compensation values are determined by using an onboard temperature control circuit (e.g., temperature sensing circuit 104, microprocessor 108, and power transistor 114) to vary the sensed temperature in the vicinity of the oscillator in increments through a range of sensed temperatures—for example in 0.5 degree C. increments from 60 degrees C. to 65 degrees C.—and using onboard compensation circuitry to determine a compensation required to achieve and/or maintain a design (or other) oscillator output frequency. In some embodiments, the compensation values are stored onboard, e.g., in a memory such as memory 110 of FIG. 1A. Each of the production PCBs is configured to use temperature gradient data common to them all, determined e.g., using the representative PCB(s) as described above (202), and the compensation values specific to that PCB (204), along with sensed ambient temperature information, to determine a compensation to be applied to the oscillator, e.g., a control voltage.

Figure 3:
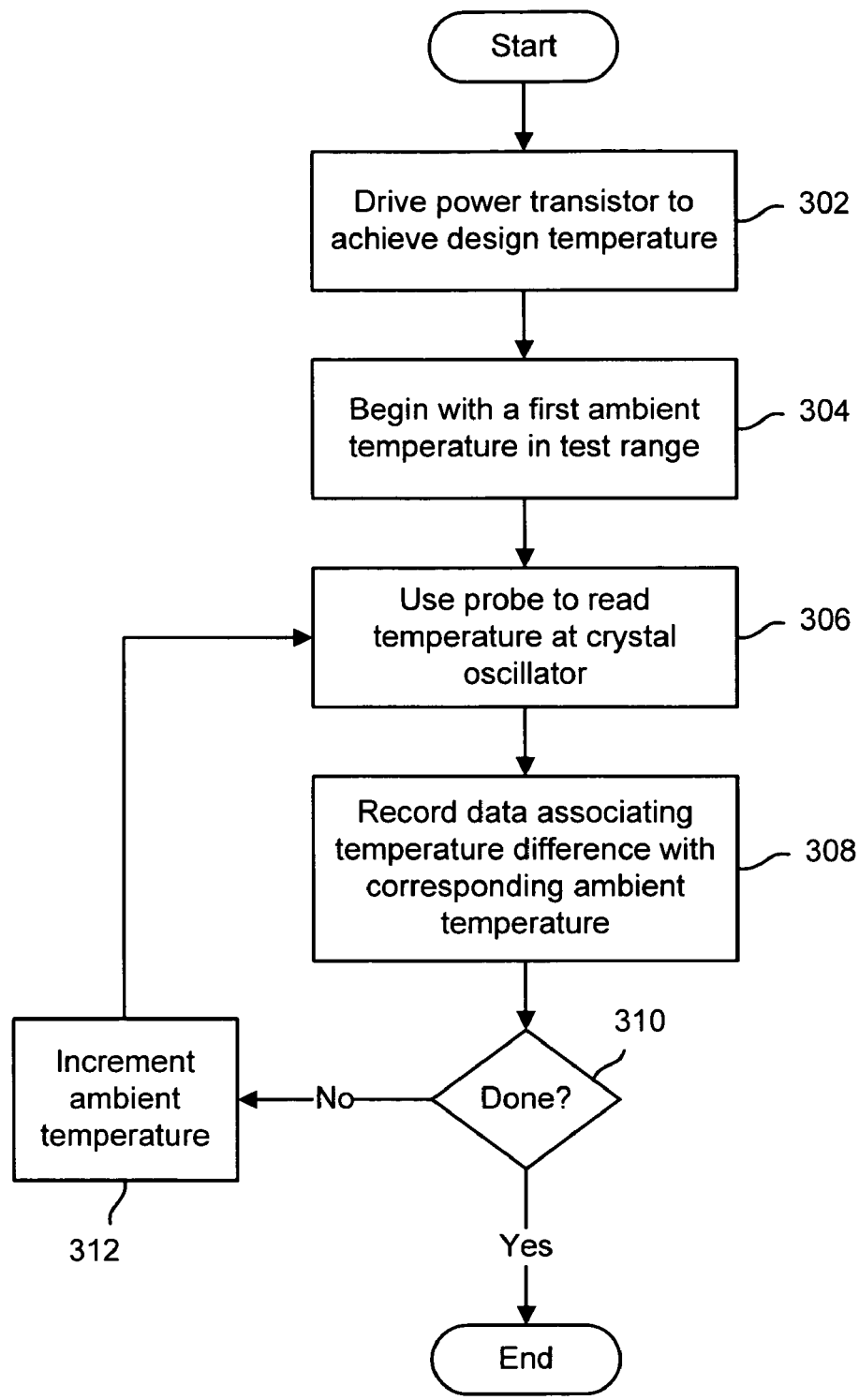
FIG. 3 is a flow chart illustrating an embodiment of a process for using a representative PCB or set of PCBs to determine a temperature gradient characteristic for a plurality of PCBs that includes at least one PCB that is not the representative PCB or a member of the representative set of PCBs.

FIG. 3 is a flow chart illustrating an embodiment of a process for using a representative PCB or set of PCBs to determine a temperature gradient characteristic for a plurality of PCBs that includes at least one PCB that is not the representative PCB or a member of the representative set of PCBs. In some embodiments, step 202 of FIG. 2 includes the process of FIG. 3. A power transistor on the representative PCB is driven to achieve a design sensed internal temperature (302). The ambient temperature is regulated as required, e.g., by heating or cooling a temperature controlled environment in which the process of FIG. 3 is being performed, to achieve a first ambient temperature in a test range, e.g., the lowest or highest temperature in the range (304). In some embodiments, the test range is selected to correspond to and/or include a range of ambient temperatures to which the PCB may be exposed during operation. In some embodiments, the range is a relatively wide range of temperatures, the highest of which is below a design internal temperature to be maintained in a thermally insulated portion of the PCB in which an oscillator, temperature sensing, and heat dissipating components are to be contained. For example, an ambient temperature range from 0 degrees C. to 50 degrees C. may be used. A temperature sensing probe is used to read a temperature at the oscillator (306). A temperature difference between the internal temperature as sensed by the internal (e.g., first) temperature sensing circuit and the temperature at the oscillator as read using the probe is determined and data associating that difference with the current ambient temperature is stored (308). The ambient temperature is subsequently incremented, e.g. by 0.5 degrees or one degree C. (or decremented, if starting at the top if the test range) (310 and 312), after which steps 306 and 308 are repeated for successive ambient temperature set points within the range until temperature gradient data (in this example the difference between the internally sensed temperature as sensed at the internal temperature sensing circuit and the temperature at the oscillator as read directly using the probe) has been determined and store for each of the set points in the test range of ambient temperature (310), after which the process ends.

Figure 4:
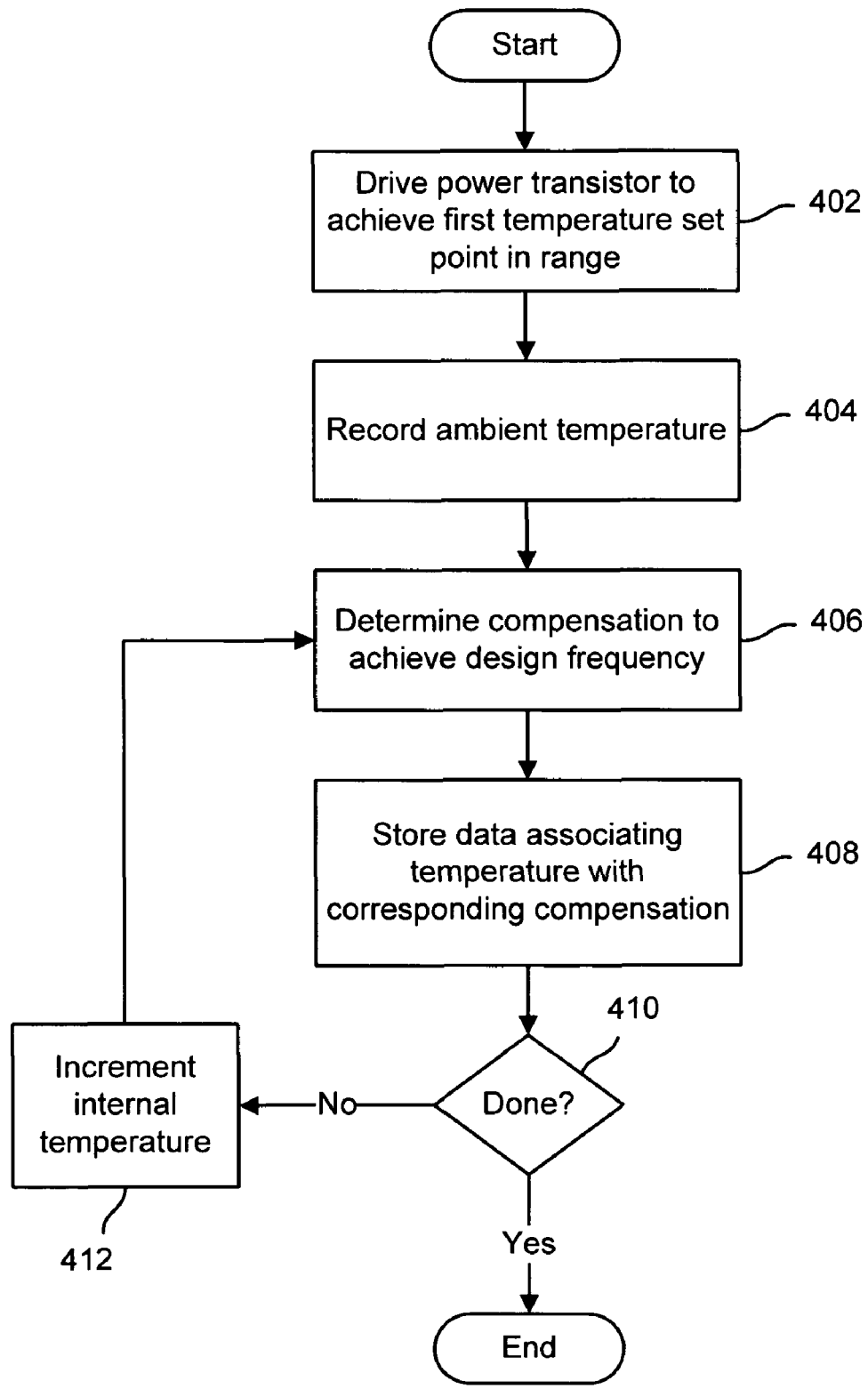
FIG. 4 is a flow chart illustrating an embodiment of a process for determining compensation versus internal temperature characteristics for individual production PCBs.

FIG. 4 is a flow chart illustrating an embodiment of a process for determining compensation versus internal temperature characteristics for individual production PCBs. In some embodiments, step 204 of FIG. 2 includes the process of FIG. 4. In the example shown, a power transistor or other heat dissipating component or circuit is driven to achieve a first internal temperature set point in a range of internal temperatures over which oscillator compensation data is to be determined (402). In some embodiments, the power transistor is driven so as to achieve (or achieve as nearly as possible) a step change from an initial (e.g., ambient) temperature to at or near the first internal set point, e.g., 60 degrees C. at the low end of a 60 to 65 degree C. range. The ambient temperature is recorded (404). In some embodiments, the process of FIG. 4 is performed for each PCB but only at the one ambient temperature at which the environment in which the process of FIG. 4 is performed happens to be maintained, e.g., a manufacturing or testing environment for the PCBs. A compensation required to achieve/maintain a design (or other) oscillator output frequency is determined (406), e.g., by comparing a monitored output with a reference and adjusting a compensation, e.g., a control voltage to the oscillator, as required to achieve and/or maintain the design (or other) oscillator output frequency. Data associating the internal temperature as currently sensed using the temperature sensing circuit adjacent to the oscillator with the compensation determined to be require to achieve and/or maintain the design (or other) oscillator output frequency at that sensed internal temperature is stored (408). In some embodiments, the foregoing data is stored in an onboard permanent storage, such the programmable read-only memory (PROM) memory 110 of FIG. 1A. The internal temperature as sensed by the internal temperature sensing circuit adjacent to the oscillator is incremented (or decremented, if starting at the high end of the range), e.g., by driving the power transistor at a level associated with the next set point in the range (410 and 412), and steps 406 and 408 are repeated for that sensed internal temperature. Steps 406-412 are repeated for each set point until compensation data has been determined and stored for all set points in the range of sensed internal temperatures over which the PCB is to be characterized (410), after which the process of FIG. 4 ends.

In some embodiments, onboard internal temperature sensing and control circuitry are used to set, sense, and adjust the internal temperature through the range of internal temperatures over which the calibration process of FIG. 4 is performed. In addition, onboard frequency monitoring and correction circuitry are used to determine the compensation data. In some embodiments, an onboard process such as microprocessor 108 of FIG. 1A is programmed to implement the process of FIG. 4.

Figure 5:
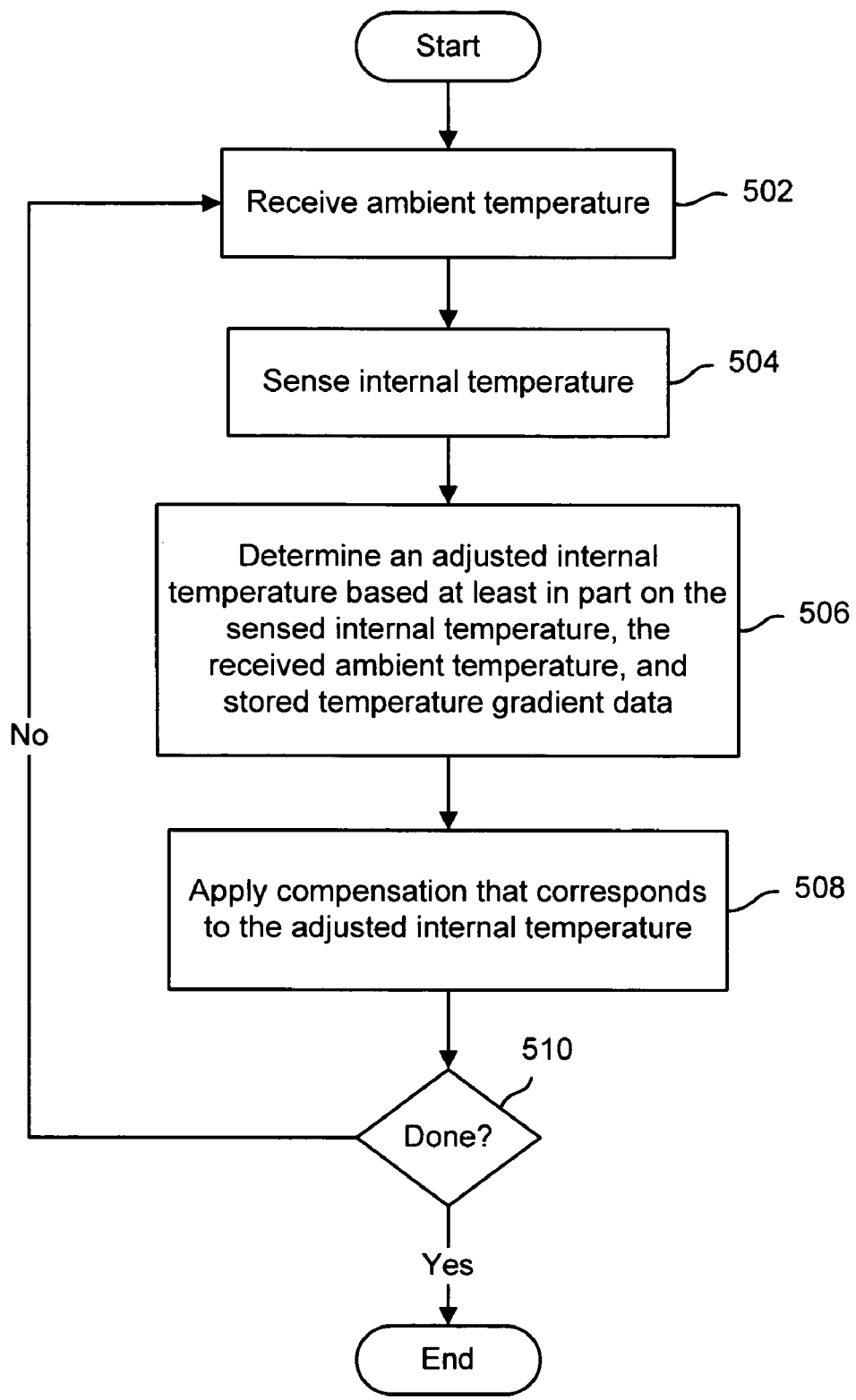
FIG. 5 is a flow chart illustrating an embodiment of a process for compensating for temperature variations to achieve and/or maintain a desired oscillator output frequency.

FIG. 5 is a flow chart illustrating an embodiment of a process for compensating for temperature variations to achieve and/or maintain a desired oscillator output frequency. In some embodiments, step 206 of FIG. 2 includes the process of FIG. 5. In the example shown, an ambient temperature is received (502). In some embodiments, the ambient temperature is sensed by an onboard temperature sensing circuit that is exposed to (i.e., not thermally insulated from) the ambient environment, such as temperature sensing circuit 112 of FIG. 1A. An internal temperature is sensed (504). As used in this context the "internal" sensed temperature is the temperature as sensed by a temperature sensing circuit or device located adjacent to the oscillator and within a thermally insulated region in which the oscillator is located, such as temperature sensing circuit 104 and thermally insulated region and/or insulating material 106 of FIGS. 1A and 1B. An adjusted internal temperature is determined (506) based at least in part on the internal temperature as sensed by the internal temperature sensing circuit (504), the received ambient temperature (502), and temperature gradient data not (necessarily) specific to that PCB and stored in an onboard storage location (e.g., memory 110 of FIG. 1A). In some embodiments the non-PCB-specific temperature gradient data is that was determined previously at least in part by performing using one or more the process of FIG. 3 with respect to one or more representative PCBs.

In step 508, a compensation (e.g., oscillator control voltage) associated with the adjusted internal temperature is applied. In the example shown in FIG. 5, steps 502-508 may be repeated until the process comes to an end (510), e.g., when the PCB is powered down. In various embodiments, steps 502-508 are repeated periodically and/or upon occurrence of a triggering event, such as a detected change in ambient and/or sensed internal temperature. For temperature readings that lie in between measured data points, the applied compensation may be determined by interpolating between the respective compensation associated with the measured data points between which the temperature reading falls, using any of several well known techniques, such as linear interpolation.

By way of example, in some embodiments step 506 includes using the received ambient temperature (502) and the store temperature gradient data to determine a temperature offset to be applied to the sensed internal temperature to determine the adjusted internal temperature. For example, if during operation the internal temperature is sensed to be 62.5 degrees C., compensation data for the PCB was determined in an environment that was at 20 degrees C., and the current ambient temperature in the environment in which the PCB is operating is determined to be 40 degrees C., depending on the temperature gradient data the sensed internal temperature may be adjusted downward (assuming the temperature gradient data showed less difference between the oscillator and sensed temperatures at ambient temperatures nearer the design internal temperature than at ambient temperatures that differed more greatly from the ambient temperature), for example by 0.5 degrees C., and a compensation associated with the adjusted internal temperature of 62 degrees C. applied, instead of a compensation associated with the internal temperature that was sensed.

The techniques described herein enable onboard circuits to be used during PCB manufacture to determine temperature/frequency characteristics of each PCB relatively rapidly without requiring each PCB to be calibrated in a test environment capable of cycling through a wide range of ambient temperature set points and without the additional time, labor, facility, materials, and concomitant costs that would be required to characterize each oscillator and/or PCB individually across the entire range of ambient temperatures. Likewise it is not necessary to incur the expense of calibrating and/or characterizing each oscillator prior to installation on a PCB and incurring the costs associated with obtaining, tracking, transferring, and storing on the correct PCB the temperature/frequency characterization data for each oscillator. Instead, relatively inexpensive oscillators may be used and each PCB calibrated and configured relatively quickly using onboard (i.e., on the PCB) circuits and components.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of crystal oscillator control and calibration, comprising:
    determining temperature gradients between a first temperature sensing circuit and a crystal oscillator for different ambient temperatures, wherein the determined temperature gradients for different ambient temperatures are used as data for future calibration of the crystal oscillator for a particular ambient temperature and a particular internal temperature, wherein the first temperature sensing circuit measures a temperature at the first temperature sensing circuit and a temperature sensing probe measures a temperature at the crystal oscillator, the first temperature sensing circuit and the crystal oscillator being part of a printed circuit board and being disposed in a heat insulating material, the ambient temperatures being measured using a second temperature sensing circuit that is also part of the printed circuit board, but is not disposed in the heat insulating material;
    storing the determined temperature gradients and associating respective temperature gradients with corresponding ambient temperatures for use for future calibration of the crystal oscillator for the particular ambient temperature and the particular internal temperature;
    determining, for a first ambient temperature, compensation parameters for the crystal oscillator for different internal temperatures, the internal temperatures being measured using the first temperature sensing circuit inside the heat insulating material, the internal temperatures being provided by a heater disposed inside the heat insulating material, the internal temperatures being higher than the ambient temperatures, a range of internal temperatures being smaller than a range of ambient temperatures.

2. The method of claim 1, wherein the measured particular internal temperature is reduced because the measured second ambient temperature is higher than the first ambient temperature.

3. The method of claim 1, wherein the heater inside the heat insulating material comprises a power transistor controlled by a processor, the processor also controlling the crystal oscillator.

4. The method of claim 3, wherein, during operation, the heater maintains the first sensing circuit at a temperature that is higher than the range of ambient temperatures.

5. The method of claim 1, wherein the heater inside the heat insulating material is used to maintain a desired internal temperature sensed by the first temperature sensing circuit as temperature gradient data is determined.

6. The method of claim 1, wherein the heater inside the heat insulating material is disposed on one side of the printed circuit board, and wherein the crystal oscillator and the first sensing circuit, disposed in the heat insulating material, are on the other side of the printed circuit board.

7. The method of claim 1, wherein the measuring of the second ambient temperature and the particular internal temperature, the adjusting of the measured particular internal temperature and the determining of the particular compensation parameter are performed periodically.

8. The method of claim 1, wherein measuring the particular internal temperature, the adjusting of the measured particular internal temperature and the determining of the particular compensation parameter are repeatedly performed when triggered by a change in the ambient temperature measured using the second temperature sensing circuit.

9. The method of claim 1, wherein the compensation values comprise internal temperature compensation values or oscillator control voltage values.

10. The method of claim 1, wherein the measuring of the second ambient temperature and the adjusting of the measured particular internal temperature and the determining of the particular compensation parameter are repeatedly performed when triggered by a change in the internal temperature measured using the first temperature sensing circuit.

11. The method according to claim 1, comprising:
    storing the first ambient temperature, the determined compensation parameters and associating respective compensation parameters with corresponding internal temperatures; and
    measuring a second ambient temperature using the second temperature sensing circuit and a particular internal temperature using the first temperature sensing circuit;
    adjusting the measured particular internal temperature based on the measured second ambient temperature and the stored first ambient temperature; and
    determining a particular compensation parameter for the crystal oscillator based on the adjusted internal temperature, the stored internal temperatures and the stored compensation parameters.

12. A method of controlling a crystal oscillator, comprising:
    storing, in a memory of a printed circuit board, different temperature gradient data and associated corresponding ambient temperature data for use for future calibration of the crystal oscillator for a particular ambient temperature and a particular internal temperature, the different temperature gradient data representing temperature gradients between a first temperature sensing circuit and a crystal oscillator for different ambient temperatures, wherein the determined temperature gradients for different ambient temperatures are used as data for future calibration of the crystal oscillator for the particular ambient temperature and the particular internal temperature, wherein the first temperature sensing circuit measures a temperature at the first temperature sensing circuit and a temperature sensing probe measures a temperature at the crystal oscillator, the first temperature sensing circuit and the crystal oscillator being disposed in a heat insulating material, the ambient temperature data representing ambient temperatures on a part of the print circuit board outside of the heat insulating material;
    storing, in a memory of the printed circuit board, crystal compensation parameters for a first ambient temperature and associated corresponding internal temperature data, the internal temperature data representing internal temperatures measured using the first temperature sensing circuit, the internal temperatures being maintained by a heater disposed inside the heat insulating material;
    measuring a current ambient temperature using a second temperature circuit disposed on the printed circuit board and outside of the heat insulating material and a current internal temperature using the first temperature circuit.

13. The method according to claim 12, comprising:
adjusting the measured current internal temperature based on the measured current ambient temperature and the stored first ambient temperature; and
determining a current compensation parameter for the crystal oscillator based on the adjusted current internal temperature, the stored internal temperature data and the stored compensation parameters.

14. A printed circuit board (PCB), comprising:
a PCB substrate having a top side and a bottom side;
a crystal oscillator and an internal temperature sensing circuit disposed in a heat insulating material on the top side of the PCB substrate;
a heater disposed in the heat insulating material on the bottom side of the PCB substrate;
a memory of the printed circuit board in which resides different temperature gradient data and associated corresponding ambient temperature data for use for future calibration of the crystal oscillator for a particular ambient temperature and a particular internal temperature, the different temperature gradient data representing temperature gradients between the internal temperature sensing circuit and the crystal oscillator for different ambient temperatures, wherein the internal temperature sensing circuit measures a temperature at the internal temperature sensing circuit and a temperature sensing probe measures a temperature at the crystal oscillator, the ambient temperature data representing ambient temperatures on a part of the print circuit board outside of the heat insulating material, the ambient temperature data being measured by an external temperature sensing circuit that is disposed on the top side of the PCB substrate and outside the heat insulating material, wherein the crystal compensation parameters for a first ambient temperature and associated corresponding internal temperature data reside in the memory, the internal temperature data representing internal temperatures measured using the internal temperature sensing circuit, the internal temperatures being maintained by the heater; and
a processor coupled to the crystal oscillator, the internal temperature sensing circuit and the external temperature sensing circuit,
wherein the processor measures a current ambient temperature using the external temperature sensing circuit and measures a current internal temperature using the internal temperature sensing circuit,
wherein the processor adjusts the measured current internal temperature based on the measured current ambient temperature and the stored first ambient temperature, and
wherein the processor determines a current compensation parameter for the crystal oscillator based on the adjusted current internal temperature, the stored internal temperature data and the stored compensation parameters.

15. The printed circuit board of claim 14, wherein the different temperature gradient data and the associated corresponding ambient temperature data are stored in a read only memory.

16. The printed circuit board of claim 14, wherein the processor measures the current ambient temperature, adjusts the measured current internal temperature and determines the current compensation parameter when triggered by a change in the measured current internal temperature.

17. The printed circuit board of claim 14, wherein the processor measures the current internal temperature, adjusts the measured current internal temperature and determines the current compensation parameter when triggered by a change in the current ambient temperature.

18. The printed circuit board of claim 14, wherein portions of the PCB substrate are removed around components inside of the heat insulating material to improved thermal isolation of the components inside of the heat insulating material.

19. A method of controlling a crystal oscillator, comprising:
storing, in a memory of a printed circuit board, different temperature gradient data and associated corresponding ambient temperature data for future calibration of the crystal oscillator for a particular ambient temperature and a particular internal temperature, wherein a first temperature sensing circuit measures a temperature at the first temperature sensing circuit and a temperature sensing probe measures a temperature at the crystal oscillator, the different temperature gradient data representing temperature gradients between the first temperature circuit and the crystal oscillator for different ambient temperatures, the ambient temperature data representing ambient temperatures on another part of the print circuit board;
storing, in the memory of the printed circuit board, crystal compensation parameters for a particular ambient temperature and associated corresponding first temperature data for use for future calibration of the crystal oscillator for the particular ambient temperature and the particular internal temperature, the first temperature data representing temperatures measured using the first temperature circuit, the first temperatures being maintained by a heater;
measuring a current ambient temperature on the another part of the printed circuit board and a current first temperature using the first temperature circuit.

20. The method according to claim 19, comprising:
adjusting the measured current first temperature based on the measured current ambient temperature and the stored particular ambient temperature; and
determining a current compensation parameter for the crystal oscillator based on the adjusted current first temperature, the stored first temperature data and the stored compensation parameters.

* * * * *